United States Patent [19]
Pullela et al.

[11] Patent Number: 5,751,593
[45] Date of Patent: May 12, 1998

[54] ACCURATE DELAY PREDICTION BASED ON MULTI-MODEL ANALYSIS

[75] Inventors: Satyamurthy Pullela; Abhijit Dharchoudhury; David T. Blaauw; Tim J. Edwards; Joseph W. Norton, all of Austin, Tex.

[73] Assignee: Motorola, Inc., Schaumburg, Ill.

[21] Appl. No.: 629,487

[22] Filed: Apr. 10, 1996

[51] Int. Cl.$^6$ .................................................. G06F 17/50
[52] U.S. Cl. ........................................... 364/488; 364/578
[58] Field of Search .................................. 364/488, 489, 364/496, 578

[56] References Cited

U.S. PATENT DOCUMENTS

| | | | |
|---|---|---|---|
| 4,827,428 | 5/1989 | Dunlop et al. | 364/491 |
| 4,924,430 | 5/1990 | Zasio et al. | 364/578 |
| 5,210,700 | 5/1993 | Tom | 364/489 |
| 5,237,514 | 8/1993 | Curtin | 364/490 |
| 5,381,524 | 1/1995 | Lewis et al. | 395/161 |
| 5,457,638 | 10/1995 | Ashar et al. | 364/490 |
| 5,475,605 | 12/1995 | Lin | 364/488 |
| 5,508,937 | 4/1996 | Abato et al. | 364/488 |
| 5,559,715 | 9/1996 | Misheloff | 364/488 |

*Primary Examiner*—Vincent N. Trans
*Attorney, Agent, or Firm*—Bruce E. Hayden; Susan C. Hill

[57] ABSTRACT

A process and implementing computer system (13) for optimally sizing elements of an integrated circuit includes determining actual arrival times and required arrival times (403) for processed signals at all nodes within the integrated circuit and determining the slack or difference (405) between arrival and required times for each node. If the actual arrival time for a particular node is after the time required to meet a predetermined design constraint of the node (407), a determination (411) is made regarding the effect of that element on the nodal slack for an incremental increase in the size of that element. Thereafter an element is selected (413) for sizing increase (415) in accordance with a weighting function and the process is repeated until all of the nodes in the integrated circuit have positive slack times (407,409). One method of accomplishing a timing analysis step (303) includes an analytical circuit simulation technique (1000-1015) in which circuit "I-V" characteristics are more precisely represented with a power series (1006) including a plurality of regional segmental approximations (901-907). Another method of timing analysis includes an equivalency methodology (1501-1513) of translating passive transistors to equivalent RC networks (801). In the overall optimization process, a method is provided (1701-1715) for automatically correcting transistor predicted sensitivities based upon a correction factor (1713). A multi-model timing method (1601-1619) is also illustrated (1601-1619) for synergistically combining fast and accurate circuit timing models to optimize the speed and accuracy of the design process itself while remaining within an accuracy threshold.

10 Claims, 8 Drawing Sheets

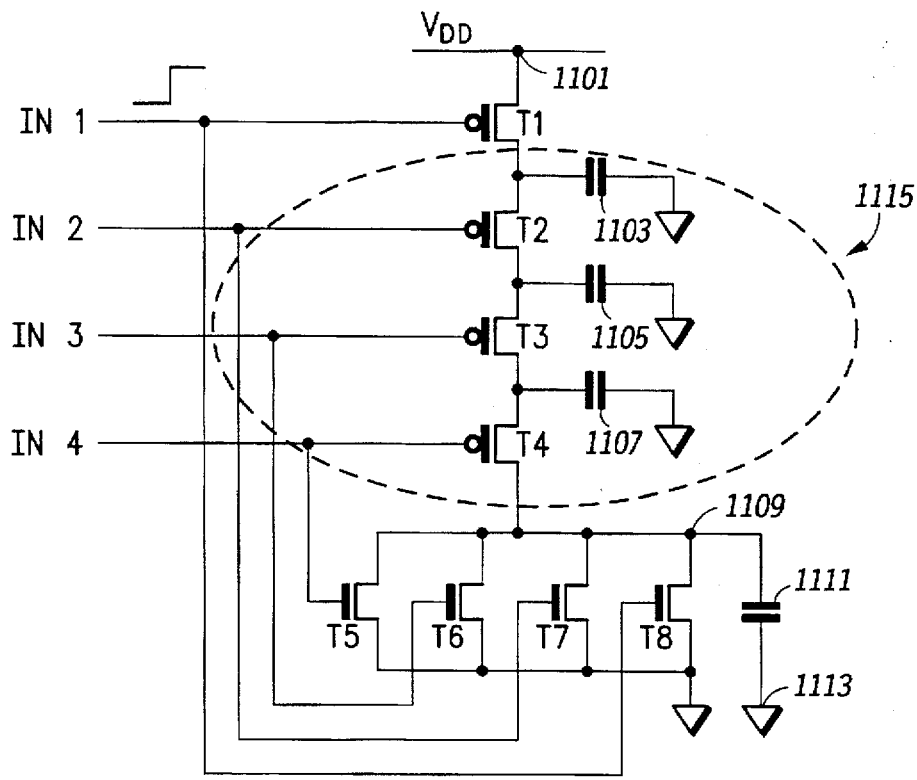
*FIG.11*
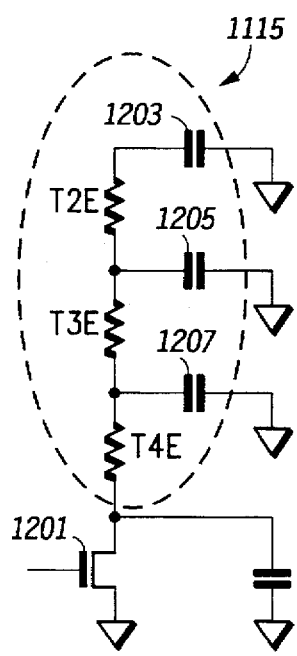
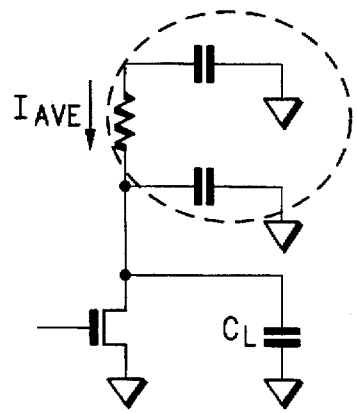
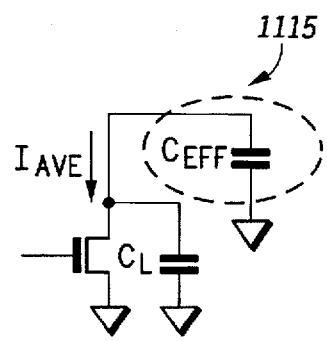
*FIG.12*  *FIG.13*  *FIG.14*

ACCURATE DELAY PREDICTION BASED ON MULTI-MODEL ANALYSIS

REFERENCE TO RELATED APPLICATIONS

The present application is related to the following U.S. patent applications:

"Element Sizing For Integrated Circuits", invented by David T. Blaauw et al., having Ser. No. 08/495,061, filed Jun. 26, 1995, and assigned to the assignee hereof;

"A Logic Gate Size Optimization Process For An Integrated Circuit Whereby Circuit Speed Is Improved While Circuit Area Is Optimized", invented by David T. Blaauw et al., having Ser. No. 08/390,210, filed Feb. 16, 1995, and assigned to the assignee hereof;

"Integrated Circuit Design And Manufacturing Method And An Apparatus For Designing An Integrated Circuit In Accordance With The Method", invented by David T. Blaauw et al., having Ser. No. 08/373,695, filed Jan. 17, 1995, and assigned to the assignee hereof;

"Updating Hierarchical Circuit Descriptions", invented by Joseph W. Norton et al., having Ser. No. 08/529,772, filed Sep. 18, 1995, and assigned to the assignee hereof;

"Power Optimization For Integrated Circuits", invented by Timothy J. Edwards et al., having Ser. No. 08/521,493, filed Aug. 30, 1995, and assigned to the assignee hereof;

"Low Power Logic Minimization For Electrical Circuits", invented by J. Greg Viot et al., having Ser. No. 08/548,929, filed Oct. 26, 1995, and assigned to the assignee hereof;

"Fast Semi-Analytical Timing Simulation Of MOS Circuits", invented by Abhijit Dharchoudhury et al., having Ser. No. 08/629,489, filed on even date herewith, and assigned to the assignee hereof;

"Complementary Network Reduction For Load Modeling", invented by Satyamurthy Pullela et al., having Ser. No. 08/805,862, filed on even date herewith, and assigned to the assignee hereof; and "Simulation Corrected Sensitivity", invented by Satyamurthy Pullela et al., having Ser. No. 08/629,488, filed on even date herewith, and assigned to the assignee hereof.

FIELD OF THE INVENTION

The present invention relates generally to integrated circuit design and more particularly to the design and manufacture of integrated circuits that are optimized with regard to certain design criteria.

BACKGROUND OF THE INVENTION

With the continuing and increasing demand for electronic devices of all kinds, there is a concurrent need to improve the quality and reduce the manufacturing time of these devices. In general, all electronic devices include at least one integrated circuit ("IC") or "chip" which integrates millions of transistors and connections on one tiny substrate of semiconductor material. The miniaturization of integrated circuits, and the products which they control, continues to be of major significance in the marketplace and a driving force to the manufacturers of such products.

In designing integrated circuits, there are several key criteria which need to be optimized with respect to each other in order to create a design and an on-chip layout for an integrated circuit which provides the best overall results within certain cost and other design constraints. Such criteria include the size of the chip, power consumption of the chip and the speed of operation for the various functions accomplished within the chip. This kind of optimization analysis is normally done on a workstation or other computer system running various analysis and design programs which, in turn, operate to weigh the relative significance of the various design criteria for each specific application in which the designed integrated circuit will be implemented.

One of the most important of these design criteria is the time delay involved in a particular design for a digital signal to travel through a particular path or paths on the integrated circuit to get to certain key points or nodes of the circuit in the minimum time possible consistent with performance requirements. Ideally, the best design of an integrated circuit is the design that enables a signal to traverse a predetermined layout between certain key points in the smallest amount of time, wherein the layout or integrated circuit consumes minimal power and requires the smallest amount of semiconductor area to implement. In most cases, these criteria are mutually conflicting so that one cannot be improved without decreasing the efficacy of another at least to some extent.

For example, in the "sizing" of particular transistors for a proposed integrated circuit design, it is noted that although increasing the area of the transistors in the design will, in general, decrease the time delay in signal transmission, it will also increase the size and power of the chip, and therefore limit the applicability of the chip in certain product areas, as well as reduce the profitability of the chip. Also, a decrease in the size of a chip will, in general, decrease its power consumption, heat generation and chip signal interference. The priority of each of the above design constraints and others, and the best possible solution for a particular application, will depend upon the application in which the integrated circuit is to be used. In most cases, the best result is obtained through a combination of trade-offs which is optimized with specific regard to, and consideration of, the specific application for the integrated circuit being designed.

In order to determine the level of optimization and evaluate the effectiveness of any particular design, certain analyses have been used in the industry. One such general evaluation technique is timing analysis which is intended to estimate the time delay of a signal through a digital circuit as described above. In the past, many such timing approaches have been used by circuit designers in order to optimize the efficacy or "strength" or size of a new combination of criteria values for a new integrated circuit design. One such approach adopted by some in the past is the method by which first, a timing analysis is made for a circuit, then a "critical path" is identified and only the components or elements on that critical path are analyzed for possible sizing optimization. While that approach is generally satisfactory, there is a need for an improved method for a more comprehensive approach to the sizing optimization of elements in an integrated circuit design.

In addition to the optimization of signal transition speed and silicon area for integrated circuits being designed, there is also a continuing need to optimize the design process itself which provides the optimized netlist, such that the desired circuit netlist and circuit optimizations can be accurately obtained more quickly and efficiently during the chip design process. That requirement can also be met through the implementation of the approaches and methods hereinafter disclosed.

BRIEF DESCRIPTION OF THE DRAWINGS

A better understanding of the present invention can be obtained when the following detailed description of the preferred embodiment is considered in conjunction with the following drawings, in which:

FIG. 11 is a circuit diagram of a gate circuit useful in explaining an equivalency methodology of circuit timing estimation;

FIG. 12 is an illustration of an intermediate step of the disclosed equivalency methodology;

FIG. 13 represents another step in the disclosed equivalency methodology;

FIG. 14 shows a final resulting equivalent circuit after execution of an exemplary equivalency methodology as herein disclosed;

DESCRIPTION OF THE PREFERRED EMBODIMENT

Figure 1:
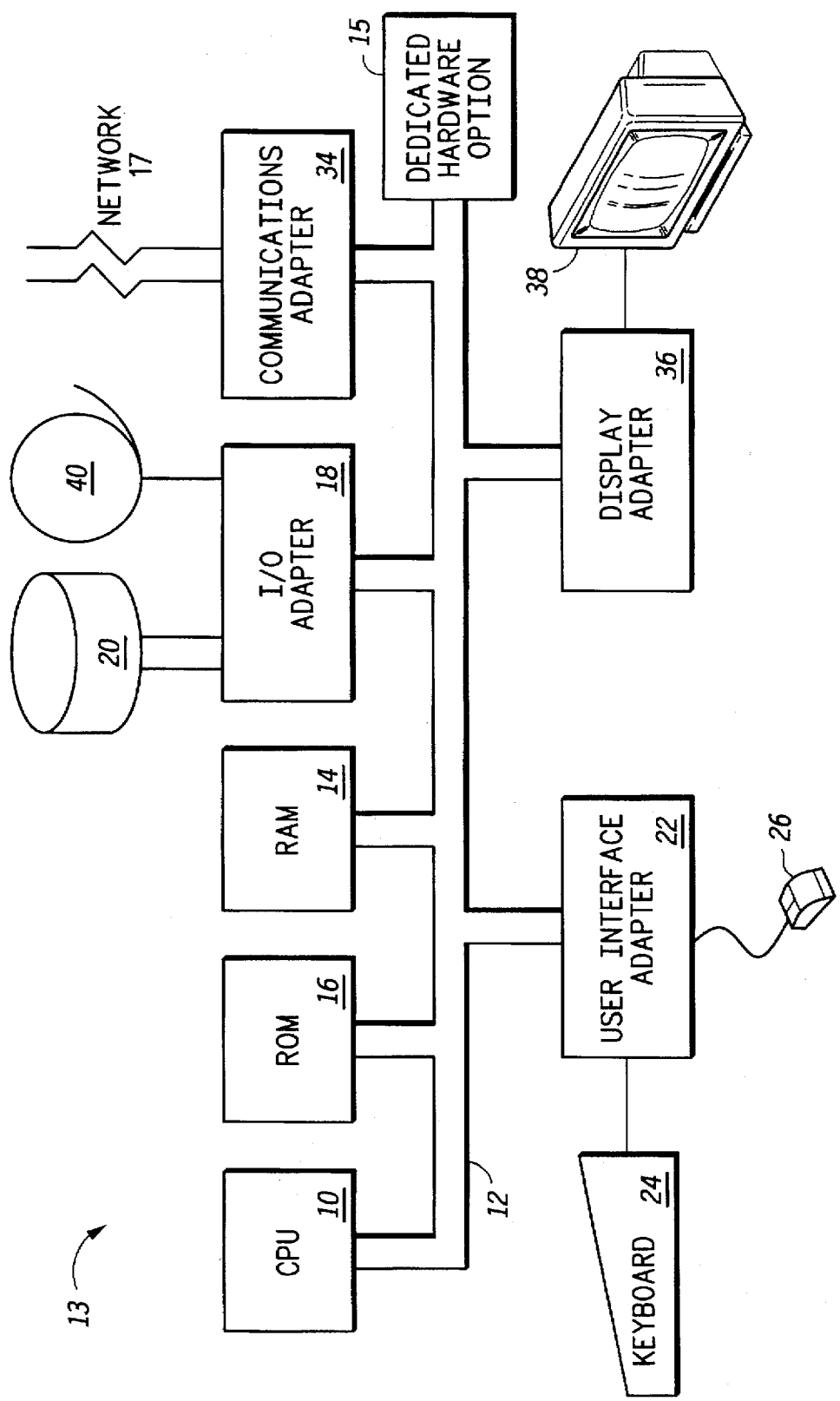
FIG. 1 is a block diagram of a system within which the various disclosed methodologies may be implemented and practiced.

The present disclosure provides improved methods and techniques for use in sizing circuits, gates and other elements implemented in the design of integrated circuits.

The slack-based sizing method disclosed herein automatically determines the size or drive strength of elements, such as, for example, transistors, gates, logic blocks, etc., in a circuit, such that the user specified timing constraints are met and the total size of the elements in the circuit is minimized. The method allows the user to automatically meet the timing constraint for a circuit while minimizing its transistor area. The method has two main benefits viz. the user can automatically obtain a circuit of the required performance without setting the element sizes by hand and the circuit is implemented with a minimum in transistor area, which, in general, reduces the total block area and power consumption of the circuit.

The overall slack-based integrated circuit design optimization system broadly includes using a slack time determination at circuit nodal points to change one or more characteristics of elements in the circuit design, in order to meet user needs and manufacturing constraints. The "strength" or "merit" characteristic of a circuit element, for example, refers to a cumulative abstract measure of that element's beneficial or desirable characteristics. In the following example, the size of an element is the specific parameter of the strength characteristic which is changed, i.e. increased, in accordance with the slack-based method. A node is a point that connects terminals of elements in a circuit. A circuit refers to a plurality of inputs and a plurality of outputs, with a plurality of paths between each input and output having a plurality of nodes. In general, the method of the present invention comprises analyzing every node in the circuit by comparing the longest time it takes for a signal to propagate to the node from any input with the earliest time it should take to propagate to that node assuming that the time it takes to propagate from the node to any output will cause the signal to arrive at the output at the desired or required time in accordance with a user constraint or specification. That time difference is defined as the slack, or the slack time, for each node. An analysis is made to determine which slack may be reduced the most by increasing the strength of an element, for example by increasing the channel width of a transistor, in a path to that node. After all nodes and elements have been analyzed, the strength is increased in the element connecting to the nodes with the greatest changeable slack in accordance with a weighted function. The method is repeated until all slacks exceed a threshold level, which is indicative of the fact that actual arrival times at all nodes are earlier than required arrival times at those nodes by the specified threshold.

The slack-based element sizing improves over existing methods in that it is not limited to selecting elements from the critical path in the circuit. Instead, all elements in the circuit are examined as candidates for a size increase on every iteration of the slack-based element sizing method. This has the advantage that an element that is not on the critical path, but has a high efficacy in moving the design to the required solution, can be selected. A second advantage is that the sensitivity of an element is not based only on its impact on its critical path through the element. The critical path through the element involves only one input node and one output node. In the slack method, the merit of the element is based on its impact on the slack of all the inputs and outputs of the element. An element that has a positive effect on all its surrounding nodes can therefore be distinguished from an element that has a positive impact on one or a few of its nodes, but a negative impact on other nodes.

In the slack-based IC element sizing method disclosed herein, the required times at the outputs of the circuit are propagated through the circuit and the earliest required time at every node in the circuit is determined. The latest arrival times for signals at each node in the circuit are also determined. The difference between the latest arrival time and the earliest required time at each node is determined as the slack of the node, i.e., in the present example, the required time minus arrival time for a node in the circuit to another, equals slack. When every node in the circuit has a slack greater than a threshold level, the circuit is considered to meet the user specified timing constraints, and the slack-based method is completed. The threshold level against which the slack is compared, is used in order to allow a user to compensate or account for inaccuracies in the timing analysis or to compensate for manufacturing process variations. If the slack is determined to be not greater than the threshold level, each element in the circuit is examined and the impact of increasing the size of an element on the slack of its input and output nodes is determined with a sensitivity or weighting function. The element in the circuit that has the most positive impact on the total slack in the circuit relative to its increase in strength, size or area, is selected. The selected element is increased in size and the slack-based sizing method is repeated.

In the timing analysis of integrated circuits, accuracy and precision of the transitional and cumulative time delays involved in alternative switching scenarios is of utmost significance. For integrated circuits which include millions of transistors, even very small inaccuracies in propagation delay models can cause relatively large errors in circuit performance estimates, especially considering the cumulative effect of such inaccuracies. Accordingly, it is essential that circuit performance optimization tools or programs deliver efficient and accurate estimates of the propagation delay and output transition time at all output nodes of designed digital circuits and gates during the circuit design process.

Cycle time reduction for circuit design requires accurate and efficient timing analysis and optimization. Typical circuit design software and process tools size transistors based on the sensitivities of the transistor widths with respect to the delay and the deviation of the delay from the actual desired value. In general, the quality of the design solution depends on the accuracy of the delay estimates. Since iterative timing optimization techniques require repeated evaluation of delays, often an extremely fast but less accurate delay computation technique is employed during optimization. However, as high accuracy timing analysis is performed less frequently, more accurate techniques, such as a circuit simulation, can be employed to enhance accuracy. Since very accurate timing models are available, although relatively slower, it is desirable to utilize the very accurate models to improve the quality of the solution but the use of such models should also be minimized in order to improve the performance of the tool and the design time for the optimization process. The disclosed multi-model simulation method and implementing apparatus as hereinafter described provides an effective combination of the various design modeling methods in order to provide very accurate circuit timing optimization while conserving the speed and efficiency of the faster timing models.

As illustrated in FIG. 1, the various methods discussed above may be implemented within dedicated hardware 15, or within processes implemented within a data processing system 13. A typical hardware configuration of a workstation which may be implemented to accomplish the methodologies disclosed herein, is illustrated and includes a central processing unit (CPU) 10, such as a conventional microprocessor, and a number of other units interconnected via system bus 12. The workstation shown in FIG. 1 includes random access memory (RAM) 14, read only memory (ROM) 16, and input/output (I/O) adapter 18 for connecting peripheral devices, such as disk units 20 and tape units 40, to bus 12. A user interface adapter 22 is used to connect a keyboard device 24 and a mouse 26 to the system bus 12. Other user interface devices such as a touch screen device (not shown) may also be coupled to the system bus 12 through the user interface adapter 22.

A communication adapter 34 is also shown for connecting the workstation to a data processing network 17. Further, a display adapter 36 connects the system bus 12 to a display device 38. The method of the present invention may be implemented and stored in one or more of the disk units 20, tape drives 40, ROM 16 and/or RAM 14, or even made available to system 13 via a network connection through communications adapter 34 and thereafter processed by CPU 10. Since the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In general, it is noted that the integrated circuits being designed for element sizing are comprised of a plurality of elements (sometimes millions of elements) including transistors and logic gates. Each such transistor or gate has an inherent signal propagation delay time associated with it, and that delay is typically measured in nanoseconds or picoseconds. Timing constraints within integrated circuits are usually specified in nanoseconds and represent the maximum allowed propagation time of a signal between two different points in an integrated circuit. Such timing constraints must be met in order for the integrated circuit to meet an overall specification relative to the speed with which signal processing must occur to provide a competitive product in the market place or to be compatible with other integrated circuits in a larger system.

The speed of an integrated circuit is proportional to its size and its strength or merit. For example, the size and strength of a transistor, is directly related to the width of a transistor gate for transistor elements. In the design of integrated circuits, in optimizing the chip, an initial design is chosen and while the number of elements, inputs and topology of the chip may remain the same, the sizes are modified for optimal size so that customer or user constraints are met but with a minimum of total chip size.

In a prior art method of integrated circuit element sizing, a chip design was first analyzed to identify the critical path of the circuit. The critical path of an integrated circuit includes elements which, when increased in size, will contribute directly to an improvement in overall circuit speed. In all integrated circuits there are elements that are not on a so-called critical path because an increase in the size of the off-critical-path element, although it may decrease the propagation delay of that element, will not impact the overall speed of the integrated circuit since a downstream gate will have to wait for a later generating signal in any event. The critical path refers to the path of elements which generate those later occurring signals and are therefore critical to the overall speed of the chip.

In the past, a timing analysis is first accomplished and then the critical path of the integrated circuit design is determined. Next, the critical path timing is analyzed to determine the "arrival times" for signals at various critical path nodes within the circuit. Next, it is determined whether the critical path time is less than that necessary to comply with a user constraint. If the critical path time is less than the user constraint specification, then, in accordance with this prior method, the overall circuit speed objective of the IC design has been met and the "sizing" job has been completed. If, however, the critical path time exceeds the user specification, further processing is required to modify the design to meet the specification. The speed or timing effect of an increase in size for each element on the critical path in the circuit is then calculated. Next, the element in the critical path that has the greatest impact on the timing of the circuit per unit size increase is determined and that element is selected to be modified. The circuit design with that modified element is again analyzed and the method is repeated until the critical path time is determined to be less than the user constraint timing. At that point, the design process is completed. With this prior method, only the elements along the critical path are analyzed and subject to possible sizing changes. Further, in the prior art method, only the "arrival" times at nodes are calculated, followed by a sizing change and then by another calculation of the new critical path arrival times.

Figure 2:
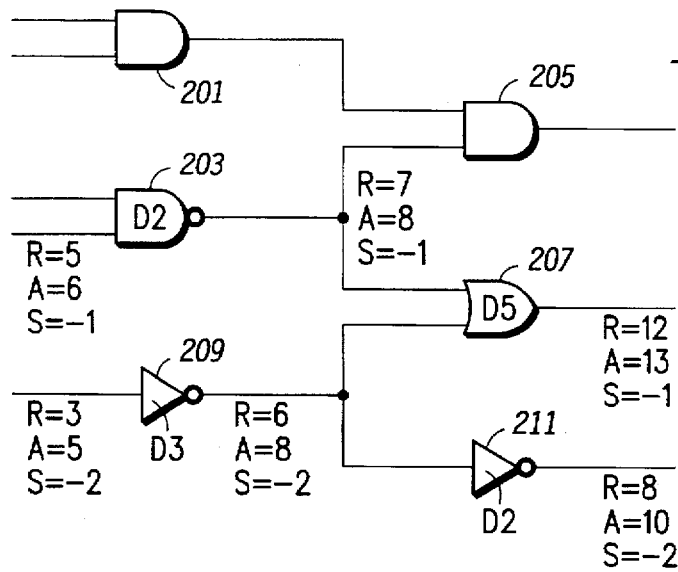
FIG. 2 is an exemplary circuit useful in explaining the slack-based method of element sizing.

To better illustrate the overall processing of an element size determination, reference should be had to FIG. 2. In FIG. 2, an exemplary portion of an integrated circuit is shown in which signals are received by gates 201 and 203 and provide output signals which are in turn applied to additional gates 205 and 207. An inverter circuit 209 also receives an input signal and applies output signals therefrom to gate 207 and another inverter 211. Each gate in the circuit shown includes an inherent signal propagation delay time. For example, gate 209 has a delay time of 3 nanoseconds (ns), which is indicated by the "D3" notation. Similarly, gates 203 and 207 have delays of 2 ns and 5 ns, respectively, associated therewith. Also inverters 209 and 211 have delays of 3 ns and 2 ns, respectively, associated with those elements.

In the illustration, the "worst case" arrival times are calculated for all outputs of the devices in the chip. The worst case arrival time is the latest time a signal could arrive at a particular node within the circuit. In FIG. 2, as an example, the arrival times "A" is 6 ns for the lower input to AND gate 203. Similarly, inverter 209 has a signal arrival time of 5 nanoseconds, and after incurring the inherent inverter 209 delay of 3 nanoseconds, emerges at the output node of the inverter 209 with an arrival time at that point of 8 nanoseconds. The times shown are arbitrary and exemplary and are selected to show the relative arrival and delay times associated with an exemplary integrated circuit portion.

Also shown in FIG. 2, are the relative "required" or user constrained times "R", at the same nodes which must be met in order to meet overall system design requirements. AND gate 203 has a required time "R" of 5 nanoseconds for example. Similarly, inverter 209 has an input R time of 3 nanoseconds, and an output R time (after adding the device delay of 3 nanoseconds) of 6 nanoseconds. Gate 207 has an output R time of 12 ns and inverter 211 has an output R of 8 ns.

In accordance with the overall slack-based element sizing method, a slack is determined for each node. As hereinbefore noted, slack time is defined as the "required" time less the "arrival" or actual time that a signal arrives at an appropriate node. The "required" time is the latest time a signal can arrive at a node and still allow the circuit to meet a specified user timing constraint. In implementing the method of the present invention, the worst case required times are calculated at all nodes. For each node, the required time is taken from its earliest output, and then preceding "required" times are calculated by subtracting the intrinsic delay of the preceding elements. In calculating slack, with regard to gate 203 for example, if the signal arrives at a 6 nanosecond mark which is 1 second after than the "required" R time of 5 nanoseconds, the node has a "slack" time of "−1" nanosecond. Inverter 209 has an arrival time A of 5 ns and a required time R of 3 ns, and therefore has a slack time of "−2" ns.

Figure 3:
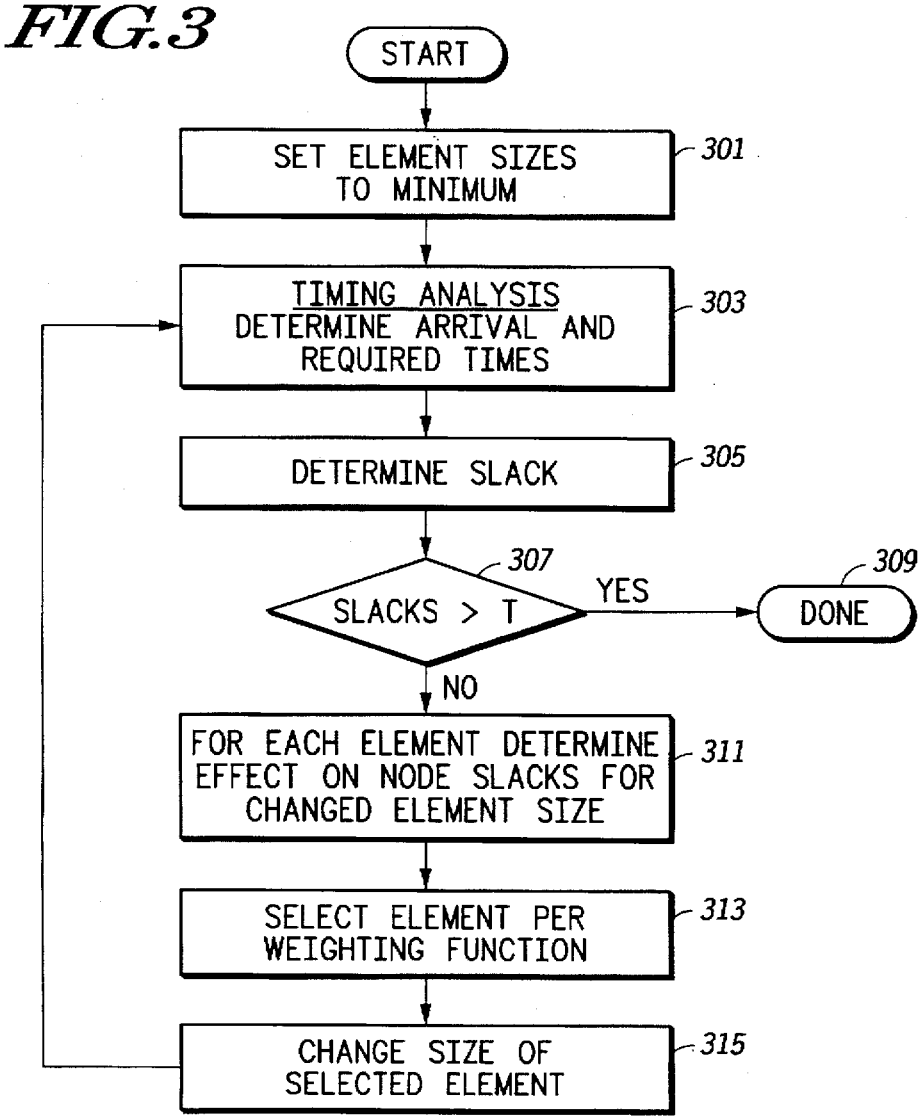
FIG. 3 is a flow diagram of the slack-based element sizing method.

As shown in FIG. 3, the overall slack-based element sizing method includes a first step of setting 301 all of the circuit element sizes to a minimum value. Although "size" or "merit" of the element is the characteristic used to explain the disclosed embodiments, it is understood that other characteristics may also be changed. Also, while the step of setting element sizes to a minimum implements one approach, it is noted that the present method may be practiced and implemented without the optional first step, shown in the FIG. 3 example, of setting all of the elements to a minimum value.

The overall method next initiates a Timing Analysis function and calculates or determines 303 the actual arrival and required arrival times for a propagated signal to appear at each element node in the circuit. This step involves analyzing the timing of the circuit by calculating the actual signal arrival times at all nodes of the circuit (or portion thereof) under consideration, and also the required signal arrival times at all of the nodes. The next step involves the calculation or determination 305 of the slack, i.e. the required time minus the arrival time, for each node in the circuit. Next it is determined 307 whether or not all of the calculated slacks are greater than a threshold level "T". If all slacks are greater than the threshold T, then the circuit and the elements have been properly sized by the slack-based process and the process is "DONE" 309. It is noted that the overall method illustrated calculates "required" times, "arrival" times and also "slack" times for each node rather than only arrival times for critical path nodes as has been typically done in the past.

If all of the slack times are not greater than the threshold T, a determination is made 311 concerning the effect on each element slack time when a certain characteristic of that element is changed. In the present example, the characteristic is the size of the element and the change is an increase in the size of the element. Next, an element is selected 313 that has the most positive impact using an appropriate or desired weighting function. An example of one weighting function would be the ratio of the improvement in slack divided by the increment in size. Following the "selecting" step 313, the size of the selected element is increased 315 and the impact of that increase in size is measured or determined on the next cycle, when the process returns to determining arrival and required times 303, until all slacks are greater than the threshold level T, at which time the process is "DONE" 309.

The overall slack-based element sizing method illustrated in FIG. 3, may be beneficially implemented by starting with the calculation of arrival and required times in the circuit as is, and without the need to initially set all element sizes to a minimum value as shown in the example. Further, the slack sign convention used in the present example may be modified so that slack is defined as actual arrival time at a node minus the desired or required time, in which case, the process will finish upon the determination that the slack for all elements is less than a threshold level. In either case, regardless of the particular convention implemented, the slack-based element sizing process disclosed herein continues to size elements in an iterative manner until all signals arrive at all elements earlier than the required time by a certain threshold level, to meet user timing constraints for the integrated circuit.

The slack-based method may also be used to decrease the size of elements or otherwise change a parameter or characteristic of an integrated circuit. For example, it may be desired to minimize the size of transistors in a circuit but not desired to minimize the size of gates. In that case, processing methodology or circuitry can be implemented and the slack of the transistor nodes can be utilized to minimize transistor size while the slack of the gates is utilized to maintain an overall circuit slack. When a positive slack is then determined, the size of an associated transistor may be decreased rather than increased, and the circuit slack may be used to insure that the overall circuit slack is kept within design constraints while the slack-based sizing method continues to minimize transistor size.

With regard, in particular, to an exemplary embodiment at a more detailed level, the timing analysis step of the overall slack-based element sizing method is now considered in connection with FIG. 4 through FIG. 10. In determining what effect a change in a characteristic of one element in an integrated circuit will have on the signals at all nodes in that circuit, an estimate is typically made based upon a computerized model. The model file includes delay times for typical circuit elements in various circuit arrangements, as well as other analytical information. One method of circuit delay time analysis involves circuit "simulation" which is typically accurate but relatively slow. Another method is known as the "Elmore" method which is typically very fast but not generally as accurate as circuit simulation. A third method is an analytical method which is between the circuit simulation method and the "Elmore" method in terms of speed and accuracy. The method described below is a fast "semi-analytical" timing simulation approach for the analysis of integrated circuits. In the illustrated example, the determination of a voltage waveform at a node in an integrated circuit will be considered. It is appreciated that this determination is made millions of times for millions of nodes in a design methodology for a single integrated circuit, and is usually implemented with a computer aided design (CAD) program created in accordance with the methodology disclosed herein. Each node being considered will be connected to other nodes in the circuit by MOS transistors, linear resistors or linear capacitors. The other nodes could be voltage supply nodes or unknown nodes whose voltage waveforms must also be determined. It is assumed that piecewise linear signals (in general polynomial in time signals) are applied at the gate terminals of the MOS transistors and that the current-voltage (I–V) characteristics of the MOS devices are modeled using the regionwise quadratic (RWQ) modeling technique.

Figure 4:
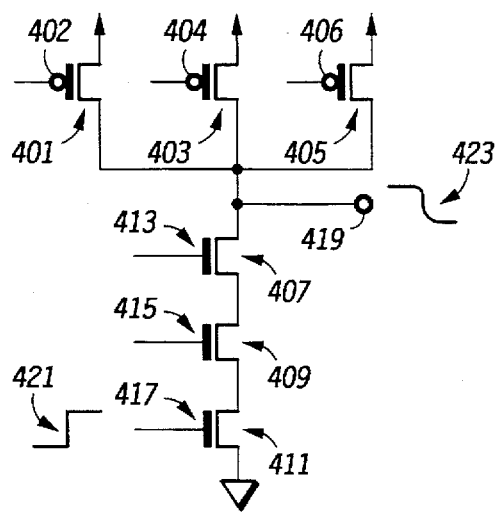
FIG. 4 is a circuit diagram of a gate circuit illustrating a typical switching operation.

For example, FIG. 4 illustrates a circuit diagram of an exemplary gate device. The circuit includes transistors 401, 403 and 405 connected in parallel between a reference voltage and a common point 419 which is also an output terminal for the gate. Each transistor 401, 403 and 405 has a gate terminal 402, 404, and 406, respectively, arranged for receiving input signals. The output terminal or node 419 is also connected through three series connected transistors 407, 409 and 411 to ground. Each of the transistors 407, 409 and 411 includes corresponding gate terminals 413, 415 and 417, respectively, arranged to receive input signals. As illustrated, input terminal 417 receives an input signal 421 of a high-going transition which causes the generation of an output signal 423 of a low-going transition at the output terminal 419. The purpose of the present fast semi-analytical timing simulation method disclosed herein is to ascertain quickly and accurately the effect that various input signals have with regard to output signals generated thereby at all of the nodes of an integrated circuit given different combinations of transistor sizes and interconnections so that an optimally sized and structured integrated circuit can be designed to meet a customer's speed requirements using only minimal silicon area on the chip. In analyzing circuit timing for an integrated circuit containing millions of transistors, it is essential to use a transistor model which will provide a precise output transition timing graph, showing an output signal transition values from one logic or voltage state to another, for various input signals as they are applied to all circuit input terminals. The more precise the model is for the input-output relationship of each transistor, the more precise will be the overall circuit simulation model and the results determined thereby.

Figure 5:
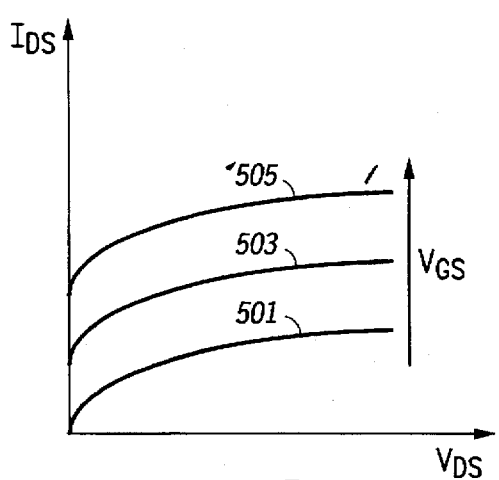
FIG. 5 is an exemplary transistor I–V characteristic chart.
Figure 6:
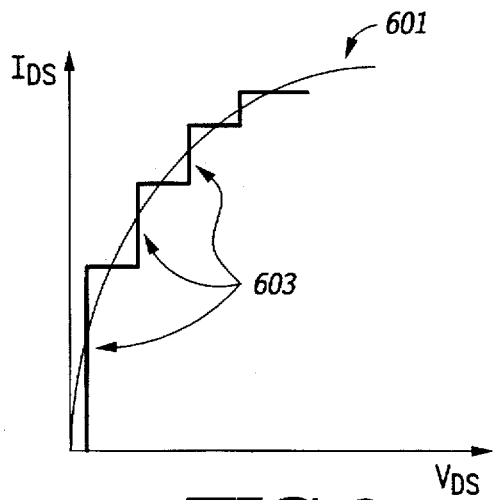
FIG. 6 is an illustration of one method of approximating a curvilinear device I–V characteristic.

FIG. 5 illustrates the "I–V" relationships among current "I", and the terminal voltages "Vds" for a transistor for three Vgs voltages 501, 503 and 505. FIG. 6 illustrates one method of approximating one exemplary I–V relationship represented by the curvilinear line 601. Curve 601 can be modeled with a series of step functions 603 of varying magnitudes as shown. This method is known as the "piecewise constant" method since the small steps along one of the axes directions is a constant and straight line pieces are joined to approximate the I–V curve 601. As can be seen, although that method is quick and easy to accomplish, the results for any given input point will be relatively coarse and not sufficiently accurate for IC modeling purposes.

Figure 7:
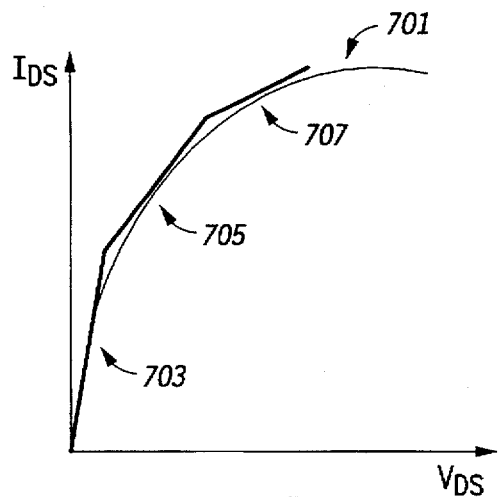
FIG. 7 is an illustration of another method of approximating a curvilinear device characteristic.
Figure 8:
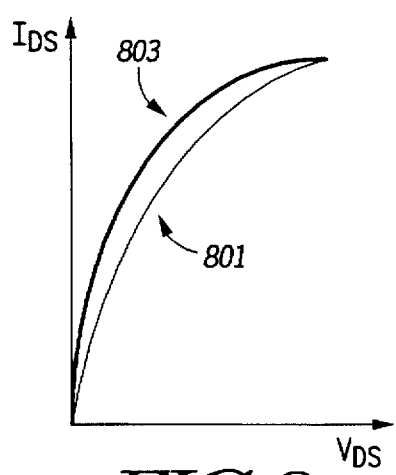
FIG. 8 is an illustration of another method of approximating a curvilinear device characteristic.

In FIG. 7, the curve 701 is modeled by a series of straight lines or piecewise linear segments 703, 705 and 707, of varying slopes. This method is a little more difficult to implement, requires a large number of segments, and also will yield relatively inaccurate results as an approximation model of the curve 701. FIG. 8 shows another modeling method known as the "Regionwise quadratic" method (RWQ), in which an I–V curve 801 is approximated by a quadratic set of functions 803. This method is a very accurate fitting for drain current but has not been very successfully applied to multiple node circuits in an accurate and efficient manner.

The presently disclosed method adopts a regionwise quadratic (RWQ) I–V model for accuracy and implements a new method to handle multiple node networks efficiently and accurately. Using the RWQ model, the drain current of an MOS transistor is expressed as a quadratic function of the terminal voltages, Vds and Vgs, in three operating regions which are analogous to cutoff, linear and saturation regions. This method, as particularly implemented in the exemplary flow shown in FIG. 10, results in much more accurate results than the previous methods. Non-linear MOS capacitances are evaluated at the current values of the terminal voltages and held constant for the duration of the current solution interval. Body-effect in MOS transistors are accounted for by evaluating the threshold voltage at the current value of Vsb and holding that value constant for the current solution interval.

Figure 10:
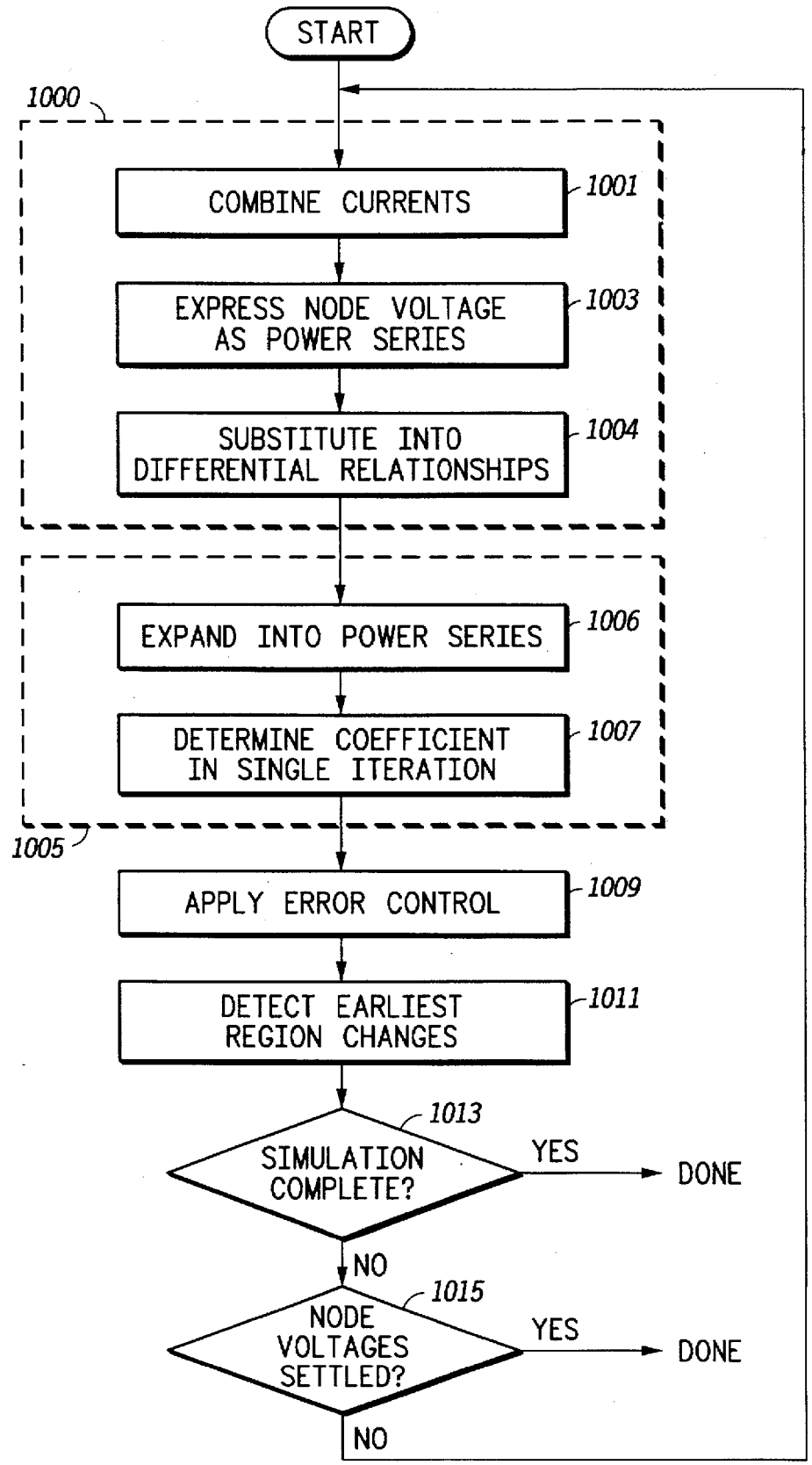
FIG. 10 is a flow chart illustrating an exemplary method implementing a multi-regional quadratic approximation of a circuit timing characteristic.
Figure 15:
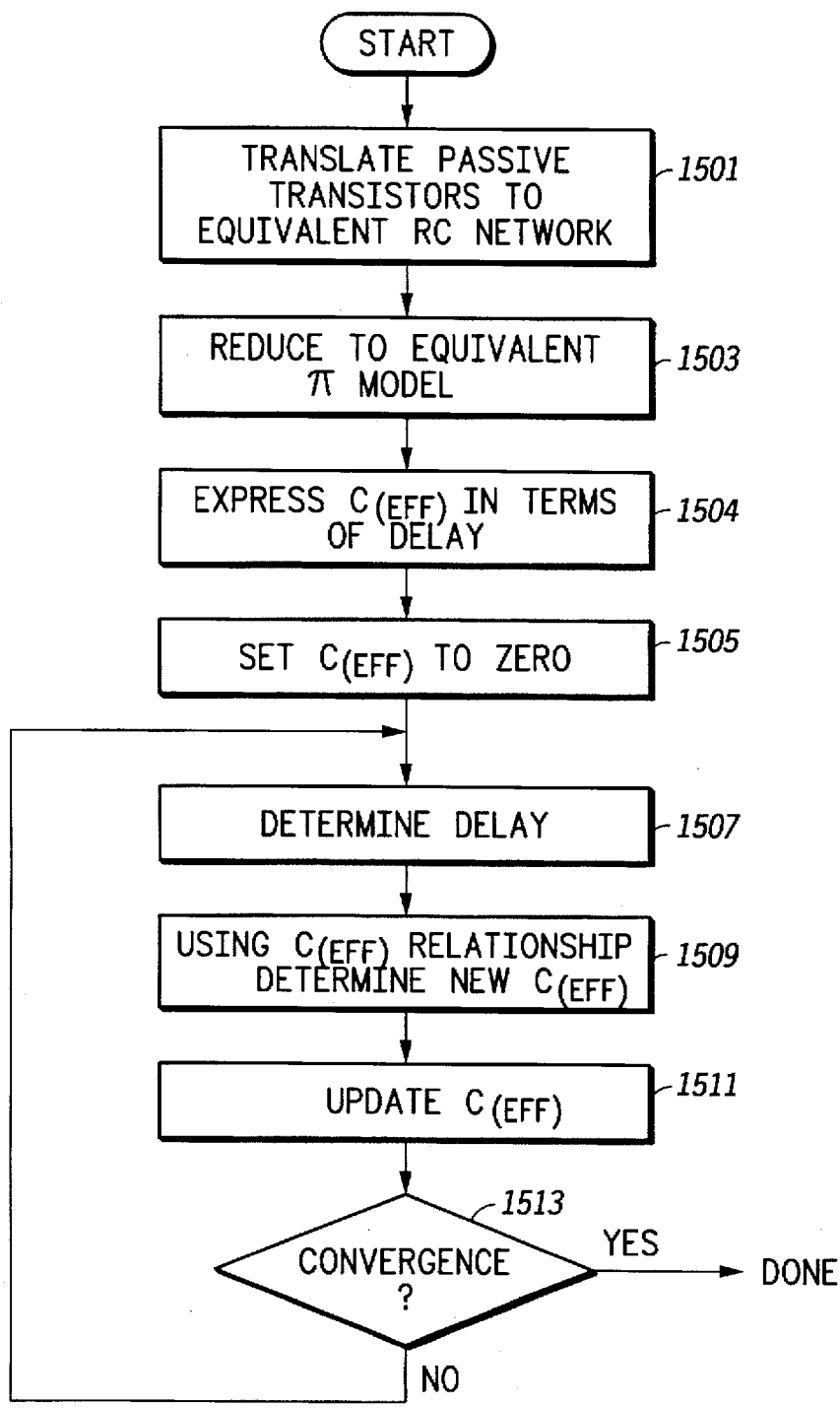
FIG. 15 is a flow diagram illustrating an exemplary sequence of steps accomplished in implementing the equivalency methodology.

The method shown in FIG. 10 begins with a step of formulating relationships 1000 between the node voltages of the gate or circuit being modeled. The formulating step includes combining or summing 1001 the currents at each node in the circuit segment being analyzed. The differential representation of the voltage V at a node in terms of time may be expressed in the form of a differential equation (DE). The differential representation is expressed in terms of the voltage of other unknown nodes, the voltage of other power supply nodes that are adjacent to the current node, and C (the capacitance to ground of that node). An initial "time 0" is assumed. Similar non-linear DEs are formed for all other unknown nodes, and a set of "n" non-linear time-dependent DEs or relationship representations, which must be solved simultaneously, is obtained, where "n" is the number of unknown circuit nodes. The next step involves expressing the node voltages as a power series in time 1003, i.e. a series of terms each having a higher exponential power than its preceding term. Next, the power series expressions are substituted into the differential relationships 1004, and unknown voltages are determined 1005 by first expanding the model into a power series 1006. On substituting the power series expressions into the differential relationship representations, a set of algebraic relationships for the coefficients is obtained. For any node, the expression for the coefficient of any particular term in the expression depends only on previous coefficients of the node voltages, and hence a simple and single iteration can be used to determine all of the coefficients in one iteration 1007.

Figure 9:
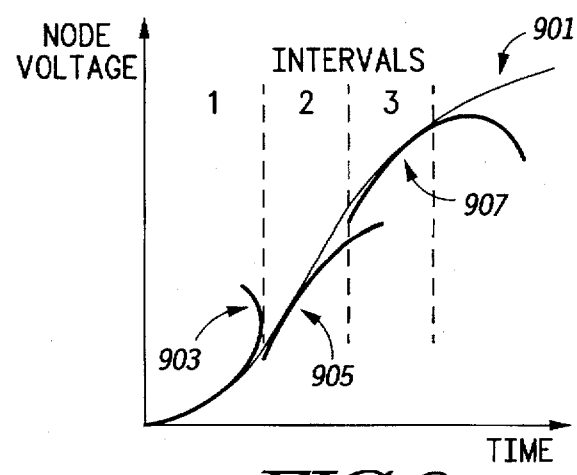
FIG. 9 illustrates the improved semi-analytical timing simulation method.

After determining the coefficients, an error control process 1009 is applied to obtain the length of each of the solution curve segments. That length represents the maximum interval of time for which the power series solution is within an error tolerance of the actual solution. The earliest region changes between solution segments are then detected 1011 to define region boundaries for the current solution. The steps described above will determine the waveforms at all nodes for a predetermined interval. Within that interval, MOS transistors may change regions of operation. Those changes, if any, have to be detected and their times of occurrence are determined by solving non-linear relationships between the variables. If there is a change in the regions of operation, the solution interval is limited to the time of the earliest change. Following the detection of the earliest regional changes 1011, a test is made to determine if the simulation is complete 1013. If the simulation is complete, then the current solution is used and the process is done. If the simulation is not complete, the process continues by determining whether or not the node voltages have settled 1015. If the node voltages have settled, then the process is done. If the node voltages are not yet settled, the process returns to the beginning step 1000 to formulate node voltage relationships. The process continues until the circuit has been simulated for the entire interval of interest, or the node voltages have settled, whichever comes earliest. The voltage waveforms are obtained in several pieces corresponding to solution intervals as illustrated in FIG. 9. These waveforms are piecewise linearized and applied to the next circuit stage or DC connected component.

Another method to perform timing analysis in IC design optimizations deals with complementary reduction for load modeling as hereinafter explained in connection with FIGS. 11 through 15. In general, timing analysis can be broken down into the timing of individual gates. For an input transition, each gate can be divided into passive transistors (i.e. turning "off") and active transistors (i.e. turning "on"). Both active and passive transistors affect the transition delay. In modeling for delay calculation, when the passive network is ignored the estimated delays are optimistic and when all of the passive network capacitances are lumped together at the output node, the estimated delays are pessimistic. A more accurate estimation of the circuit delays may be determined through an implementation of the method now described in connection with FIGS. 11 through 15. FIG. 11 shows a typical CMOS transistor network which serves an example of a gate circuit which is undergoing a timing analysis to provide an estimate of the circuit delay in yielding an output signal in response to an input signal.

Existing methods for estimation of delay fall mainly into two categories: (1) ignore the effect of the passive or complementary network which results in an underestimation of the circuit delay in the signal transition by about 30–50%; and (2) Lump the total capacitance of the complementary network along with the load capacitance which results in the total delay being over-estimated by 50–60%. The present solution and methodology reduces the error to within a significantly lower percentage. The exemplary circuit shows four inputs IN1, IN2, IN3 and IN4. Those input lines are connected to the gate terminals of four corresponding series-connected passive transistors T1, T2, T3 and T4. The four series transistors T1–T4 are connected in series between a reference voltage source Vdd 1101 and a reference point 1109 in the circuit. Terminal capacitances 1103, 1105 and 1107 are shown connecting the common points between the series connected transistors to a ground or low logic level 1113. A second set of four active transistors T5, T6, T7 and T8 are connected in parallel between the reference point 1109 and the low logic potential level. Another capacitor 1111 is also shown connected between the reference point 1109 and the low logic level at common point 1113. In the present example, transistors T2, T3 and T4, which are circled 1115, will be converted to a simple effective capacitance as graphically illustrated in FIG. 12, FIG. 13 and FIG. 14, and as expressed in flow form in FIG. 15. In FIG. 12 transistors T2, T3 and T4 are converted to equivalent RC networks including equivalent resistors T2E, T3E and T4E, and capacitors 1203, 1205 and 1207. FIG. 13 shows a reduction to an equivalent "π" (i.e. "pi") model, and FIG. 14 shows the model circuit with an effective capacitance C(eff) derived through the implementation of the method shown in FIG. 15.

Whenever an input transition is applied to the circuit, the output node of the circuit transitions from one logic level to the other, and there is an inherent delay between the input transition and the resulting output transition. It is important to realize that in addition to the transistors in the primary network, the complementary network also contributes to the overall delay of the transition. To estimate that delay without loss of accuracy, it is important that the loading due to the complementary network be modeled accurately. The complementary network is reduced to an RC network which for the purpose of delay estimation mimics the original circuit. Clearly large complementary circuits can consume large amounts of simulation time. Here a method is presented to reduce the load presented by the complementary side to a very simple yet very accurate first order model, the "effective capacitance" which can be determined by the steps illustrated in FIG. 15. Specifically, the method begins at START and operates to translate passive transistors to an equivalent RC network 1501. One way of doing this is to replace each transistor with a precalibrated value of resistance and source and drain capacitances. Next the RC circuit is reduced to an equivalent lower order "π" (i.e. "pi") model 1503. This model has been shown to be extremely accurate for the purposes of delay computation. Next an expression is derived for C(eff) from the π model 1504 using current averaging. C(eff) depends upon the delay and the delay depends upon C(eff). Therefore, C(eff) is set to zero initially 1505, and the delay is determined 1507. C(eff) is then determined using the delay 1509, and the C(eff) value is then updated 1511. Thereafter, if there is convergence 1513 the process is DONE. If there is no convergence, the process is returned to the DETERMINE DELAY step 1507, and steps 1507, 1509 and 1511 are repeated until there is convergence. With the effective capacitance method as herein disclosed, the right value of the load is computed without resorting to full scale circuit simulation. The single effective capacitance representation for the entire passive network is extremely simple and there are virtually no simulation costs incurred, and the effective capacitance C(eff) can be evaluated independently of the transistor model being used for delay evaluation.

Figure 16:
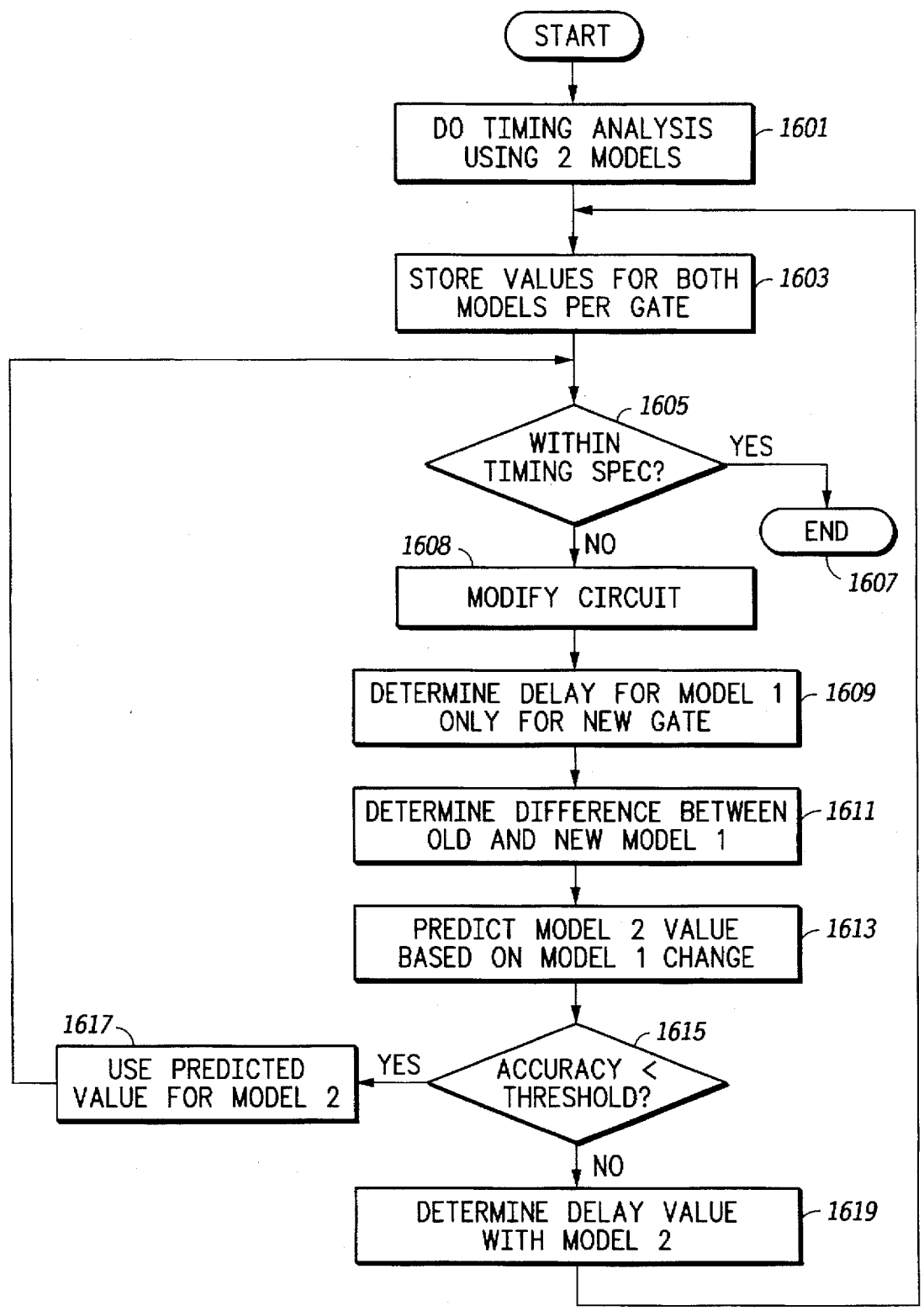
FIG. 16 is a flow chart illustrating a multi-model method for cycle time reduction in a circuit optimization process.

The multi-model timing analysis method or process illustrated in FIG. 16 relies on the fact that the error or deviation between a fast delay evaluation and an accurate delay evaluation for a circuit or gate, can be used to predict the corresponding deviation for the same circuit with small modifications, such as small changes in the size of its transistors, as long as the modified circuit remains in the "close neighborhood" of the original circuit. That deviation can be used to predict the new accurate delay based on the knowledge of the approximate delay of the modified circuit. An assumption is made regarding the definition of "close neighborhood" and the validity of that assumption is determined by specifying a threshold value beyond which the modified circuit is no longer considered as being in the neighborhood. Whenever the threshold is exceeded, a new delay is calculated using the more accurate but slower model and the new delay is utilized for a new "neighborhood". Specifying a threshold value between zero and infinity provides a smooth trade-off between the speed and the quality of the solution.

As shown in FIG. 16, the multi-model method begins by accomplishing a timing analysis 1601 for two circuit delay models, a fast but less accurate model M1 (such as a so called "Elmore" model), and a more accurate but slower model M2 (such as full circuit simulation model). Next, for each gate in the integrated circuit being designed, the delay values determined for both models are stored 1603. If the model circuit delay is within a timing specification of a customer 1605 the process is completed and the processing ends 1607. If, however, the model timing is not within spec, the circuit is modified to improve the circuit characteristics, for instance by changing the transistor size for one or more elements in the circuit 1608. The delay for the new modified gates is then determined for the relatively fast model M1 1609. Thereafter, the difference between the old delay value and the new delay value in the M1 environment is determined 1611. A prediction is then made for an M2 change 1613 based upon the change occurring in the fast model M1. Next, the accuracy of the predicted change is tested relative to an accuracy threshold value 1615. If the accuracy is within the threshold value then the predicted value for the M2 delay is used 1617 and the process is repeated. It is noted that if the accuracy is within the threshold 1615, a very accurate "M2-like" result has been obtained by the fast model M1 without incurring the slower processing time of model M2. If the accuracy of the delay is outside of the threshold value, then the more accurate but relatively slower model M2 is utilized 1619 to bring the accuracy back within line or within the threshold value on the next iteration of the process. Thus by predicting changes based upon "neighborhoods" in implementing a relatively fast modeling method, and then testing the result to make sure it is still in the "threshold neighborhood", an optimum use of both extra fast models and extra accurate models is implemented to provide ideal results.

Figure 17:
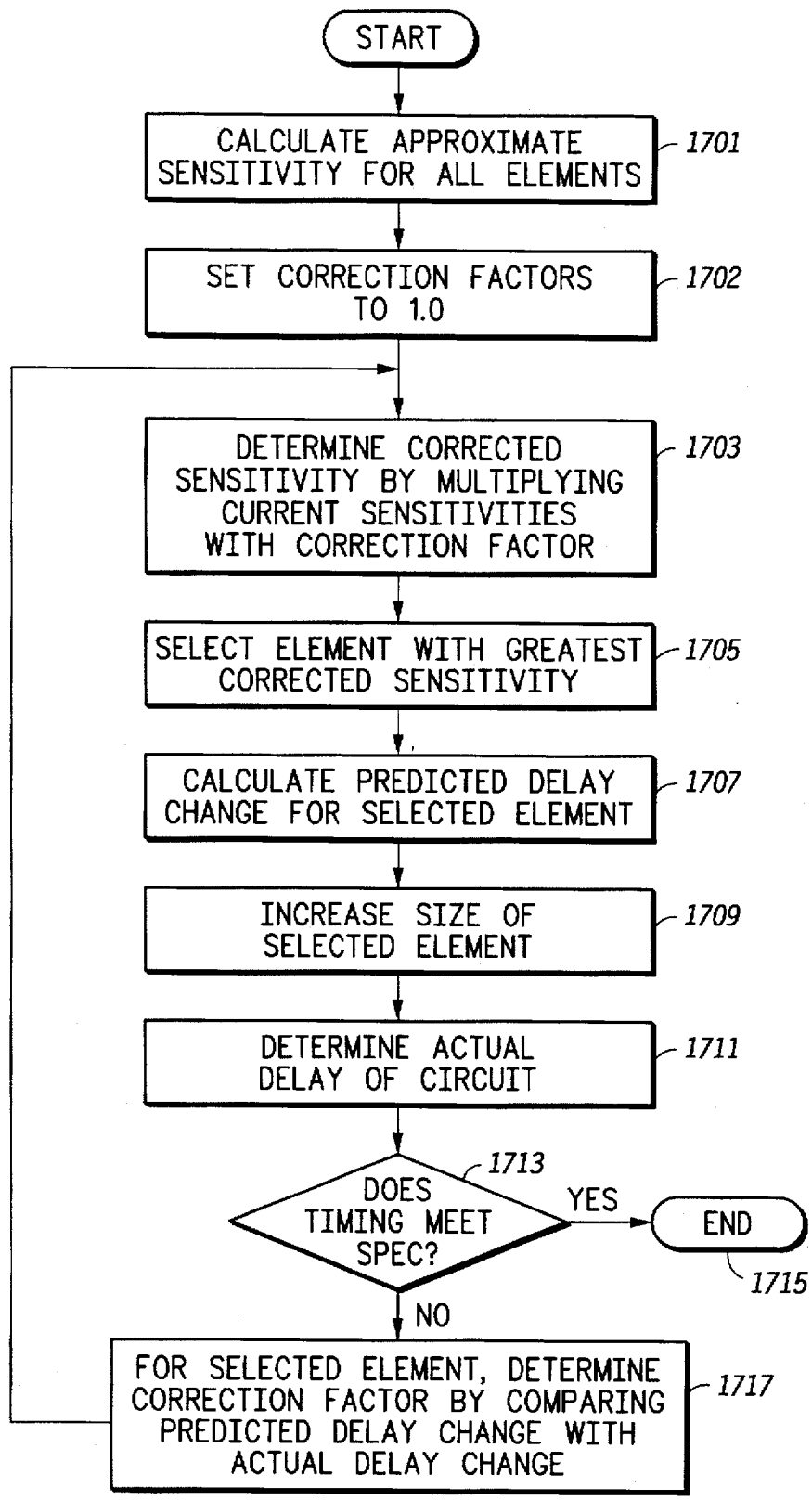
FIG. 17 is a flow chart illustrating a correction factor method for improved accuracy in fast circuit optimization design models.

With reference to the correction factor method illustrated in FIG. 17, it is noted that transistor sizing methods typically use a sensitivity-based optimization technique. The sensitivity of a transistor is a prediction of the impact that increasing the size of that transistor has on the delay of the circuit viz-a-viz the increase in the transistor size. The sensitivity forms a figure of merit for the transistor on which the circuit size optimization is based. Since the sensitivity is a prediction, it is rarely exact. Not until the transistor has actually been increased in size and the circuit delay is recalculated for the entire circuit, is it known what the actual impact of the transistor size increase on the circuit delay is. Moreover, since the sensitivity calculation must be performed for each element in the circuit at each iteration of the optimization process, the sensitivity calculation is typically based on a fast simplified model with marginal accuracy as hereinbefore explained. In the FIG. 17 method, the sensitivities calculated for a transistor are automatically adjusted based on past sensitivity estimates and the actual delay change when the transistor is sized. An approximate sensitivity for all of the elements is calculated 1701. The correction factor for each element is then set to a value of "1" 1702, and corrected sensitivities are determined by multiplying the current sensitivities with its correction factor 1703. Next the element with the greatest corrected sensitivity is selected for a size increase 1705. Next a "predicted" delay change is calculated for the selected element 1707. Thereafter, the size of the selected element is increased 1709 and the actual new delay of the circuit is determined 1711. At this point in the process, the delay is tested for compliance with a circuit timing requirement specification 1713 and if there is compliance within a threshold, the process ends 1715. Otherwise, a correction factor for the selected element is updated determined 1717 by comparing the predicted delay change 1707 with the actual delay change 1711. The process then returns to determine corrected sensitivities 1703 by multiplying the current or existing sensitivities by their respective correction factors. In this manner, when a first transistor is sized in the vicinity of a second transistor, the correction factor of the second transistor is decayed by a fixed percentage to the value "1.0" in the present example. The described approach has the advantage that it automatically improves the sensitivities that are calculated during the size optimization, without adding significantly to the complexity or processing time of the optimization process.

The methods and implementing apparatus of the present invention has been described in connection with the preferred embodiments as disclosed herein. Although exemplary embodiments of the present invention have been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A method for performing a timing analysis for a circuit being designed, said method comprising:

applying a first circuit model to determine a circuit signal propagation delay;

periodically testing an accuracy characteristic of said circuit signal propagation delay; and applying a more accurate second circuit model whenever said accuracy characteristic is determined to be outside of a predetermined threshold level.

2. A storage medium which is selectively coupled to a processing circuit, said processing circuit including a medium reading device selectively operable to read said storage medium and provide program signals representative of indicia present on said storage media to the processing circuit, said storage medium being selectively operable in combination with said processing circuit for providing a method for performing a timing analysis for a circuit being designed, said method comprising:

applying a first circuit model to determine a circuit signal propagation delay;

periodically testing an accuracy characteristic of said circuit signal propagation delay; and applying a more accurate second circuit model whenever said accuracy characteristic is determined to be outside of a predetermined threshold level.

3. A method for performing a collective timing analysis for a circuit being designed, said method comprising, for each circuit element in each of first and second circuit models:

performing a ting analysis for both said first and said second circuit models;

storing values for both models for each circuit element;

testing for compliance with a circuit timing requirement;

ending said method if said compliance is met, otherwise:

determining a delay value for said first model for a newly sized circuit element;

determining a first circuit model difference between old and new delays for said first circuit model, said new delay being based on said newly sized circuit element;

predicting a delay change for said second circuit model based upon said first circuit model difference;

using said predicted delay change for said second circuit model if a determined accuracy for said second circuit model delay change is greater than a predetermined threshold, otherwise determining a delay value using said second circuit model; and returning to said step of storing values for both models.

4. The method as set forth in claim 3 wherein said second circuit model is effective to accomplish said timing analysis with more accuracy but requiring a greater amount of time for said timing analysis than said first circuit model.

5. The method as set forth in claim 4 wherein said circuit elements comprise gate circuits.

6. A storage medium which is selectively coupled to a processing circuit, said processing circuit including a medium reading device selectively operable to read said storage medium and provide program signals representative of indicia present on said storage media to the processing circuit, said storage medium being selectively operable in combination with said processing circuit for providing a method for performing a timing analysis for a circuit being designed, said method comprising, for each circuit element in each of first and second circuit models:

performing a timing analysis for both said first and said second circuit models;

storing values for both models for each circuit element;

testing for compliance with a circuit timing requirement;

ending said method if said compliance is met, otherwise:

determining a delay value for said first model for a newly sized circuit element;

determining a first circuit model difference between old and new delays for said first circuit model, said new delay being based on said newly sized circuit element;

predicting a delay change for said second circuit model based upon said first circuit model difference;

using said predicted delay change for said second circuit model if a determined accuracy for said second circuit model delay change is greater than a predetermined threshold, otherwise determining a delay value using said second circuit model; and returning to said step of storing values for both models.

7. The method as set forth in claim 6 wherein said second circuit model is effective to accomplish said timing analysis with more accuracy but requiring a greater amount of time for said timing analysis than said first circuit model.

8. The method as set forth in claim 7 wherein said circuit elements comprise gate circuits.

9. A method for optimizing characteristics of a circuit being designed, said method comprising the steps of:

determining a required time at which a propagated input signal must arrive at predetermined nodes of a plurality of elements within the circuit, in order to enable the circuit to provide an output signal at a specified output time, said required time being measured from a predetermined input start time;

determining corresponding arrival times measured from said predetermined input start time, said corresponding arrival times being representative of times which said propagated input signal actually arrives at said predetermined nodes;

calculating a slack time at each of said predetermined nodes, said slack time being representative of a time difference between the arrival time and the required time;

selecting an element in accordance with a predetermined weighting function with regard to said slack times; and changing a characteristic of said selected element;

wherein said step of determining corresponding arrival times further includes:

applying a first circuit model to determine a circuit signal propagation delay;

periodically testing an accuracy characteristic of said circuit signal propagation delay; and applying a more accurate second circuit model whenever said accuracy characteristic is determined to be outside of a predetermined threshold level.

10. A storage medium which is selectively coupled to a processing circuit, said processing circuit including a medium reading device selectively operable to read said storage medium and provide program signals representative of indicia present on said storage media to the processing circuit, said storage medium being selectively operable in combination with said processing circuit for optimizing characteristics of a circuit being designed, by accomplishing the steps of:

determining a required time at which a propagated input signal must arrive at predetermined nodes of a plurality of elements within the circuit being designed, in order to enable the circuit being designed to provide an output signal at a specified output time, said required time being measured from a predetermined input start time;

determining corresponding arrival times measured from said predetermined input start time, said corresponding arrival times being representative of times which said propagated input signal actually arrives at said predetermined nodes;

calculating a slack time at each of said predetermined nodes, said slack time being representative of a time difference between the arrival time and the required time;

selecting an element in accordance with a predetermined weighting function with regard to said slack times; and changing a size characteristic said selected element;

wherein said step of determining corresponding arrival times further includes:

a method for performing a timing analysis for a circuit being designed, said method comprising:

applying a first circuit model to determine a circuit signal propagation delay;

periodically testing an accuracy characteristic of said circuit signal propagation delay; and applying a more accurate second circuit model whenever said accuracy characteristic is determined to be outside of a predetermined threshold level.

* * * * *